United States Patent
Shu et al.

(10) Patent No.: US 8,242,495 B2
(45) Date of Patent: Aug. 14, 2012

(54) DIGITAL X-RAY DETECTING PANEL AND METHOD FOR MANUFACTURING THE SAME

(75) Inventors: Fang-An Shu, Hsinchu (TW); Lee-Tyng Chen, Hsinchu (TW); Henry Wang, Hsinchu (TW); Wei-Chou Lan, Hsinchu (TW)

(73) Assignee: E Ink Holdings Inc., Hsinchu County (TW)

( * ) Notice: Subject to any disclaimer, the term of this patent is extended or adjusted under 35 U.S.C. 154(b) by 264 days.

(21) Appl. No.: 12/699,033

(22) Filed: Feb. 2, 2010

(65) Prior Publication Data

US 2011/0024739 A1 Feb. 3, 2011

(30) Foreign Application Priority Data

Jul. 28, 2009 (TW) .............................. 98125438 A

(51) Int. Cl.
*H01L 29/10* (2006.01)
*H01L 29/12* (2006.01)
*H01L 27/01* (2006.01)
*H01L 27/12* (2006.01)

(52) U.S. Cl. ..... 257/43; 257/350; 257/458; 257/E29.11; 257/E29.151

(58) Field of Classification Search .................. 257/43, 257/350, 458, E29.117, E29.151
See application file for complete search history.

(56) References Cited

U.S. PATENT DOCUMENTS

| | | | |
|---|---|---|---|
| 5,079,426 A * | 1/1992 | Antonuk et al. | 250/370.09 |
| 6,021,173 A * | 2/2000 | Brauers et al. | 378/98.8 |
| 6,034,725 A * | 3/2000 | Franklin et al. | 348/310 |
| 6,740,884 B2 * | 5/2004 | Lee et al. | 250/370.08 |
| 6,777,685 B2 * | 8/2004 | Lee | 250/370.09 |
| 6,849,853 B2 * | 2/2005 | Ikeda et al. | 250/370.09 |
| 7,307,301 B2 * | 12/2007 | Possin et al. | 257/292 |
| 7,429,723 B2 * | 9/2008 | Mochizuki et al. | 250/208.1 |
| 7,728,329 B2 * | 6/2010 | Joo et al. | 257/59 |
| 7,944,010 B2 * | 5/2011 | Okada | 257/428 |
| 7,964,903 B2 * | 6/2011 | Joo et al. | 257/292 |
| 8,044,445 B2 * | 10/2011 | Hayashi et al. | 257/292 |
| 2003/0201396 A1 * | 10/2003 | Lee | 250/370.09 |
| 2004/0159794 A1 * | 8/2004 | Morii et al. | 250/370.11 |
| 2006/0091390 A1 * | 5/2006 | Morii et al. | 257/59 |
| 2006/0124932 A1 * | 6/2006 | Joo et al. | 257/59 |
| 2007/0210257 A1 * | 9/2007 | Masuda et al. | 250/370.09 |
| 2008/0246064 A1 * | 10/2008 | Kimura | 257/292 |
| 2008/0302969 A1 * | 12/2008 | Jung et al. | 250/370.09 |
| 2009/0026383 A1 * | 1/2009 | Kim et al. | 250/370.11 |
| 2009/0026509 A1 * | 1/2009 | Hayashi et al. | 257/292 |
| 2009/0189231 A1 * | 7/2009 | Okada | 257/428 |
| 2009/0194672 A1 * | 8/2009 | Tredwell et al. | 250/208.1 |
| 2009/0230311 A1 * | 9/2009 | Mochizuki et al. | 250/370.09 |
| 2009/0250699 A1 * | 10/2009 | Okada | 257/53 |

(Continued)

*Primary Examiner* — Ngan Ngo
(74) *Attorney, Agent, or Firm* — Chun-Ming Shih

(57) ABSTRACT

A digital X-ray detecting panel includes a wavelength transforming layer and a photoelectric detecting plate. The wavelength transforming layer is configured for transforming X-ray into visible light. The photoelectric detecting plate is disposed under the wavelength transforming layer. The photoelectric detecting plate includes a substrate and a number of photoelectric detecting units disposed on the substrate and arranged in an array. Each of the photoelectric detecting units includes a thin film transistor and a photodiode electrically connected to the thin film transistor. The thin film transistor has an oxide semiconductor layer. The digital X-ray detecting panel can avoid a photocurrent in the thin film transistor, and thereby improving detecting accuracy of the digital X-ray detecting panel. A method for manufacturing the digital X-ray detecting panel is also provided.

9 Claims, 4 Drawing Sheets

U.S. PATENT DOCUMENTS

| | | | |
|---|---|---|---|
| 2009/0267121 A1* | 10/2009 | Ishida et al. | 257/292 |
| 2010/0059804 A1* | 3/2010 | Hayashi et al. | 257/292 |
| 2010/0127279 A1* | 5/2010 | Takahashi | 257/80 |
| 2010/0163737 A1* | 7/2010 | Masuda et al. | 250/366 |
| 2010/0163882 A1* | 7/2010 | Jung | 257/59 |
| 2010/0320391 A1* | 12/2010 | Antonuk | 250/366 |
| 2011/0127534 A1* | 6/2011 | Weisfield et al. | 257/59 |
| 2011/0266599 A1* | 11/2011 | Ishida et al. | 257/292 |
| 2012/0007096 A1* | 1/2012 | Yamazaki | 257/72 |

* cited by examiner

DIGITAL X-RAY DETECTING PANEL AND METHOD FOR MANUFACTURING THE SAME

CROSS-REFERENCE TO RELATED APPLICATIONS

This application is based upon and claims the benefit of priority from the prior Taiwanese Patent Application No. 098125438, filed Jul. 28, 2009, the entire contents of which are incorporated herein by reference.

BACKGROUND

1. Field of the Invention

The present invention relates to a digital X-ray detecting device, and particularly to a digital X-ray detecting panel and a method for manufacturing the same.

2. Description of the Related Art

Digital X-ray detecting devices are widely used in a lot of fields because of nondestructive detection characteristic. A conventional digital X-ray detecting device generally includes a digital X-ray detecting panel and a driving circuit electrically connected to the digital X-ray detecting panel. The digital X-ray detecting panel is used for transforming optical signals into electric signals and sending the electric signals to the driving circuit, and thereby obtaining an image information corresponding to the optical signals. The digital X-ray detecting panel generally includes a wavelength transforming layer and a photodetector array substrate. The wavelength transforming layer (e.g. scintillator) is used for transforming X-ray into visible light. The photodetector array substrate is disposed under the wavelength transforming layer and is used for transforming the visible light into electric signals. The photodetector array substrate generally includes a substrate and a number of photodetectors disposed on the substrate and arranged in an array.

FIG. 1 is a schematic view of a photodetector of a conventional digital X-ray panel. Referring to FIG. 1, each photodetector 100 of a conventional X-ray panel is disposed on the substrate 105. The photodetector 100 includes an amorphous silicon thin film transistor (a-Si TFT) 110 and a photodiode 120 electrically connected to the amorphous silicon thin film transistor 110. The amorphous silicon thin film transistor 110 includes a first metal layer 111, an insulating layer 112, an amorphous silicon layer 113, an ohmic contacting layer 114 and a second metal layer 115 formed on the substrate 105 in order.

The amorphous silicon thin film transistor 110 is electrically connected to the corresponding photodiode 120 through the second metal layer 115. However, it is well known that the amorphous silicon material has a sensitive property. After the X-ray is transformed into the visible light having a wavelength of 550 nanometers by the wavelength transforming layer 130, the visible light will cause to produce a photocurrent in the amorphous silicon layer 113 of the amorphous silicon thin film transistor 110. Thus, an electric leakage is caused in the amorphous silicon thin film transistor 110, so the digital X-ray detecting panel has a poor detecting accuracy. In order to solve this problem, a metal layer 140 is generally formed above the amorphous silicon thin film transistor 110. The metal layer 140 is used for blocking the visible light so as to prevent the visible light illuminating the amorphous silicon thin film transistor 110.

Because of the formation of the metal layer 140, the process of manufacturing the conventional digital X-ray detecting panel becomes more complex, and thereby increasing the cost of the conventional digital X-ray detecting panel and decreasing the manufacturing efficiency of the conventional digital X-ray detecting panel.

In addition, the amorphous silicon layer 113 of the amorphous silicon thin film transistor 110 of the conventional digital X-ray detecting panel is generally formed by a plasma enhanced chemical vapor deposition (PECVD) process. Because a processing temperature of the PECVD process is high (about 380 Celsius degrees), the high processing temperature when forming the amorphous silicon layer 113 may affect other materials of the conventional digital X-ray detecting panel, and thereby reducing the quality of the conventional digital X-ray detecting panel.

BRIEF SUMMARY

The present invention provides a digital X-ray detecting panel to avoid a photocurrent produced in a thin film transistor due to visible light, and thereby increasing the detecting accuracy of the digital X-ray detecting panel.

The present invention provides a method for manufacturing the digital X-ray detecting panel to increase the manufacturing efficiency of the digital X-ray detecting panel.

To achieve the above-mentioned advantages, the present invention provides a digital X-ray detecting panel including a wavelength transforming layer and a photoelectric detector array substrate. The wavelength transforming layer is configured for transforming X-ray into visible light. The photoelectric detector array substrate is disposed under the wavelength transforming layer. The photoelectric detector array substrate includes a substrate and a number of photoelectric detecting units. The photoelectric detecting units are disposed on the substrate and arranged in an array. Each of the photoelectric detecting units includes a thin film transistor and a photodiode electrically connected to the thin film transistor. The thin film transistor has an oxide semiconductor layer.

In one embodiment provided by the present invention, the digital X-ray detecting panel further includes a driving integrate circuit electrically connected to the photoelectric detector array substrate.

In one embodiment provided by the present invention, each of the thin film transistors further includes a first metal layer, a first insulating layer and a second metal layer. The first metal layer is disposed on the substrate. The first insulating layer is disposed on the substrate and covers the first metal layer. The oxide semiconductor layer is disposed on the first insulating layer and above the first metal layer. The second metal layer is disposed on the first insulating layer and covers a part of the oxide semiconductor layer. Each of the thin film transistors is electrically connected to the corresponding photodiode through the second metal layer.

In one embodiment provided by the present invention, each of the photodiodes is an NIP type photodiode. The NIP type photodiode includes an n-type doped amorphous silicon layer, an amorphous silicon intrinsic layer, a p-type doped amorphous silicon layer and a transparent electrode layer. The n-type doped amorphous silicon layer is disposed on the second metal layer of a corresponding thin film transistor. The amorphous silicon intrinsic layer is disposed on the n-type doped amorphous silicon layer. The p-type doped amorphous silicon layer is disposed on the amorphous silicon intrinsic layer. The transparent electrode layer is disposed on the p-type doped amorphous silicon layer.

In one embodiment provided by the present invention, each of the photodiodes is an MIS type photodiode. The MIS type photodiode includes an insulating layer, an amorphous silicon intrinsic layer, an n-type doped amorphous silicon layer and a transparent electrode layer. The insulating layer is disposed on the second metal layer of a corresponding thin film transistor. The amorphous silicon intrinsic layer is disposed on the insulating layer. The n-type doped amorphous silicon layer is disposed on the amorphous silicon intrinsic layer. The transparent electrode layer is disposed on the n-type doped amorphous silicon layer.

In one embodiment provided by the present invention, the photoelectric detector array substrate further includes a second insulating layer and a protecting layer. The second insulating layer covers the thin film transistors and the photodiodes. The second insulating layer has a number of a first openings corresponding to the photodiodes. A part of each of the photodiodes is exposed from the corresponding first opening. The protecting layer is disposed on the second insulating layer and has a number of second openings corresponding to the first openings.

In one embodiment provided by the present invention, the oxide semiconductor layer is made of a material of amorphous indium gallium zinc oxide.

In one embodiment provided by the present invention, a thickness of the oxide semiconductor layer is from 500 angstroms to 1500 angstroms.

In one embodiment provided by the present invention, a thickness of the oxide semiconductor layer is from 600 angstroms to 900 angstroms.

To achieve the above-mentioned advantages, the present invention also provides a method for manufacturing a digital X-ray detecting panel. The method includes the following process. Firstly, a number of thin film transistors are formed on a substrate. An oxide semiconductor layer of each of the thin film transistors is formed by a sputtering process. Then, a photodiode is formed on a second metal layer of each of the thin film transistors.

In one embodiment provided by the present invention, the oxide semiconductor layer is made of a material of amorphous indium gallium zinc oxide.

In one embodiment provided by the present invention, a temperature of the sputtering process is a room temperature.

In one embodiment provided by the present invention, a sputtering gas of the sputtering process includes an oxygen and an argon. A ratio of the oxygen and the sputtering gas is from 0.02 to 0.15.

In one embodiment provided by the present invention, a sputtering gas of the sputtering process includes an oxygen and an argon. A ratio of the oxygen and the sputtering gas is from 0.03 to 0.09.

In one embodiment provided by the present invention, the method further includes the processes of: forming an insulating layer to cover the thin film transistors and the photodiodes and forming a protecting layer on the insulating layer. The insulating layer has a number of a first openings corresponding to the photodiodes. A part of each of the photodiodes is exposed from the corresponding first opening. The protecting layer has a number of second openings corresponding to the first openings.

The digital X-ray detecting panel of the present invention includes the thin film transistors having the oxide semiconductor layers. The visible light transformed from the X-ray by the wavelength transforming layer can not cause the photocurrent in the oxide semiconductor layers of the thin film transistors. This prevents an electric leakage generated in the thin film transistors. Such that, the detecting accuracy of the digital X-ray detecting panel can be increased without forming a metal layer above the thin film transistors to block the visible light. In addition, in the method for manufacturing the digital X-ray detecting panel of the present invention, the processes of forming a metal layer to block the visible light and forming an ohmic contacting layer are not necessary anymore. As a result, the cost of manufacturing the digital X-ray detecting panel can be reduced, and the manufacturing efficiency of the digital X-ray detecting panel can be increased.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
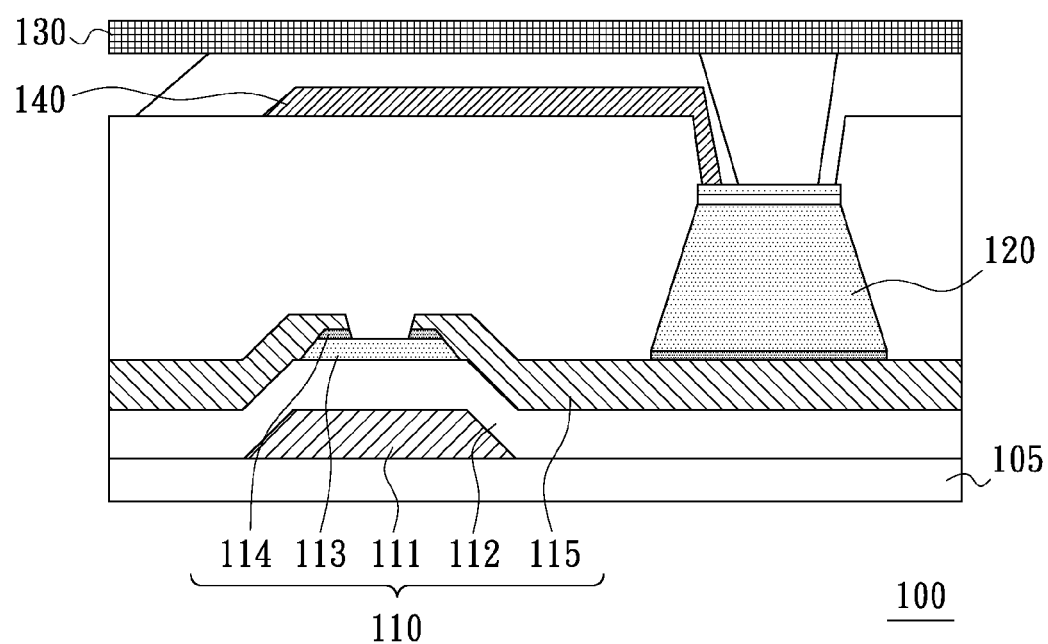
FIG. 1 is a schematic view of a photodetector of a conventional digital X-ray detecting panel.
Figure 2:
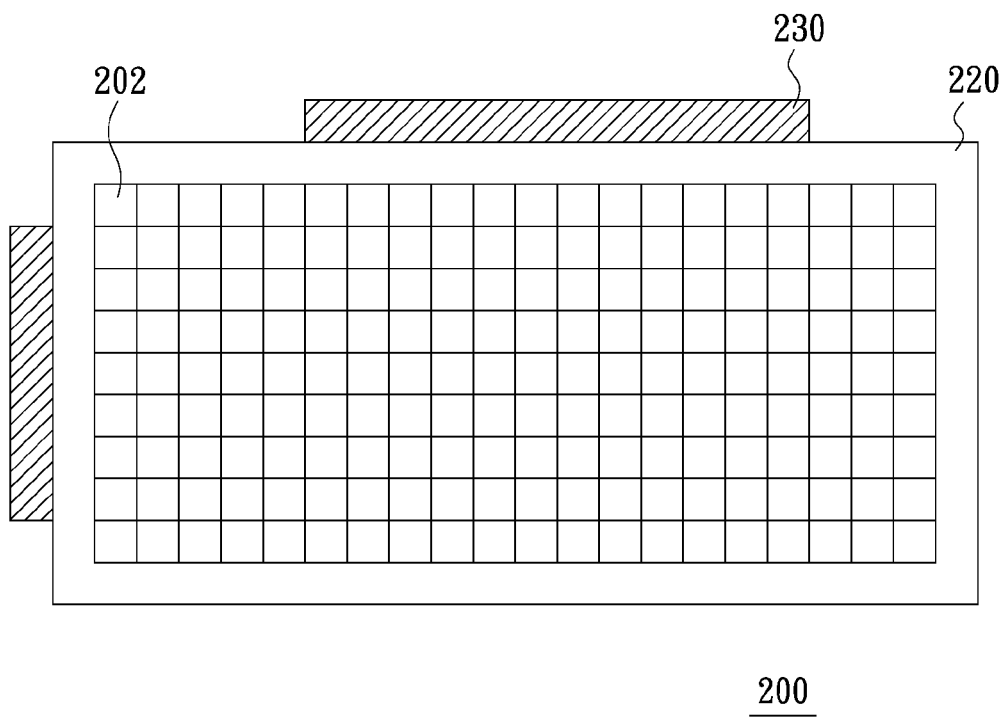
FIG. 2 is a schematic view of a digital X-ray detecting panel in accordance with an embodiment of the present invention.
Figure 3:
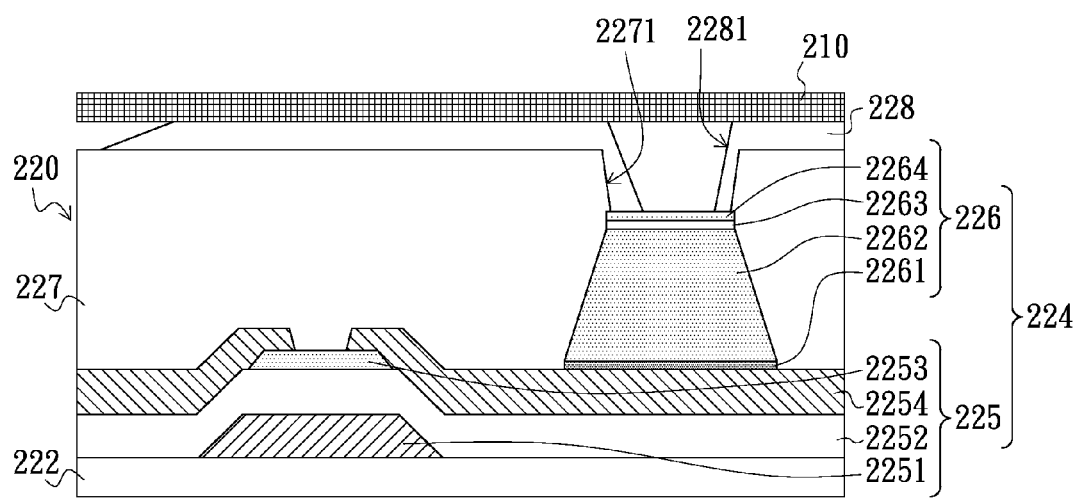
FIG. 3 is a schematic, cross-sectional view of a pixel of the digital X-ray detecting panel shown in FIG. 2.

FIG. 2 is a schematic view of a digital X-ray detecting panel in accordance with an embodiment of the present invention. FIG. 3 is a schematic, cross-sectional view of a pixel of the digital X-ray detecting panel shown in FIG. 2. Referring to FIG. 2, in the present embodiment, the digital X-ray detecting panel 200 includes a number of pixels 202. The structure corresponding to each pixel 202 is identical. Therefore, a structure corresponding to a pixel of the digital X-ray detecting panel 200 is shown to denote the digital X-ray detecting panel 200 in the following description.

Referring to FIG. 3, in the present embodiment, the digital X-ray detecting panel 200 includes a wavelength transforming layer 210 (e.g. scintillator) and a photoelectric detector array substrate 220. The photoelectric detector array substrate 220 is disposed under the wavelength transforming layer 210.

The wavelength transforming layer 210 is made of, but not limited to, a material of gadolinium oxysulfide ($Gd_2O_2S$, GOS). The wavelength transforming layer 210 is configured for transforming X-ray into visible light. That is, the X-ray for detecting passes through the wavelength transforming layer 210 to become the visible light. A wavelength of the visible light is about, but not limited to, 550 nanometers.

The photoelectric detector array substrate 220 is configured for transforming optical signals of the visible light formed by the X-ray passing through the wavelength transforming layer 210 into electric signals. The photoelectric detector array substrate 220 includes a substrate 222 and a number of photoelectric detecting units 224. In the present embodiment, the digital X-ray detecting panel 200 includes a number of photoelectric detecting units 224 arranged in an array. The substrate 222 can be, but not limited to, a transparent glass substrate. Each of the photoelectric detecting units 224 includes a thin film transistor 225 and a photodiode 226 electrically connected to the thin film transistor 225.

The thin film transistor 225 is disposed on the substrate 222. The thin film transistor 225 includes a first metal layer 2251, a first insulating layer 2252, an oxide semiconductor layer 2253 and a second metal layer 2254. The first metal layer 2251 is disposed on the substrate 222. The first insulating layer 2252 is disposed on the substrate 222 and covers the first metal layer 2251. The oxide semiconductor layer 2253 is disposed on the first insulating layer 2252 and above the first metal layer 2251. The second metal layer 2254 is disposed on the first insulating layer 2252 and covers a part of the oxide semiconductor layer 2253. The thin film transistor 225 is electrically connected to the corresponding photodiode 226 through the second metal layer 2254.

Material of the first metal layer 2251 can be molybdenum (Mo), chromium (Cr) or a combination of molybdenum and chromium. A thickness of the first metal layer 2251 is, for example, from 1700 angstroms to 2300 angstroms. Preferably, the thickness of the first metal layer 2251 is about 2000 angstroms. Material of the first insulating layer 2252 can be silicon nitride (Si3N4), silicon dioxide (SiO2) or other suitable material. A thickness of the first insulating layer 2252 is, for example, from 1500 angstroms to 2500 angstroms. Preferably, the thickness of the first insulating layer 2252 is about 2000 angstroms. The oxide semiconductor layer 2253 is made of a material of amorphous indium gallium zinc oxide (e.g. a-In2O3-Ga2O3-ZnO or a-InGaZnO4) or other suitable material. The suitable material refers to material have no photocurrent produced therein under the irradiation of the visible light. A thickness of the oxide semiconductor layer 2253 is, for example, from 500 angstroms to 1500 angstroms. Preferably, the thickness of the oxide semiconductor layer 2253 is from 600 angstroms to 900 angstroms. Material of the second metal layer 2254 can be molybdenum (Mo), chromium (Cr) or a combination of molybdenum and chromium. A thickness of the second metal layer 2254 is, for example, from 1700 angstroms to 2300 angstroms. Preferably, the thickness of the second metal layer 2254 is about 2000 angstroms.

In the present embodiment, the photodiode 226 can be an NIP type photodiode. The NIP type photodiode includes an n-type doped amorphous silicon layer 2261, an amorphous silicon intrinsic layer 2262, a p-type doped amorphous silicon layer 2263 and a transparent electrode layer 2264. The n-type doped amorphous silicon layer 2261 is disposed on the second metal layer 2254 of the corresponding thin film transistor 225. The amorphous silicon intrinsic layer 2262 is disposed on the n-type doped amorphous silicon layer 2261. The p-type doped amorphous silicon layer 2263 is disposed on the amorphous silicon intrinsic layer 2262. The transparent electrode layer 2264 is disposed on the p-type doped amorphous silicon layer 2263. The transparent electrode layer 2264 can be made of a material of indium tin oxide (ITO).

Figure 4:
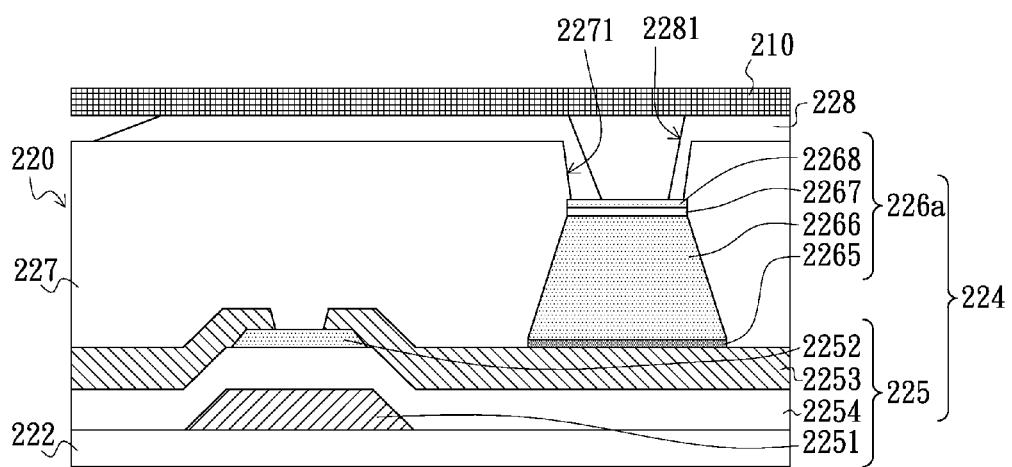
FIG. 4 is a schematic, cross-sectional view of a pixel of a digital X-ray detecting panel in accordance with another embodiment of the present invention.

Additionally, referring to FIG. 4, in another embodiment of the present invention, each photodiode 226a of a digital X-ray detecting panel 200a can be an MIS type photodiode. The MIS type photodiode includes an insulating layer 2265, an amorphous silicon intrinsic layer 2266, an n-type doped amorphous silicon layer 2267 and a transparent electrode layer 2268. The insulating layer 2265 is disposed on the second metal layer 2254 of the corresponding thin film transistor 225. The amorphous silicon intrinsic layer 2266 is disposed on the insulating layer 2265. The n-type doped amorphous silicon layer 2267 is disposed on the amorphous silicon intrinsic layer 2266. The transparent electrode layer 2268 is disposed on the n-type doped amorphous silicon layer 2267.

The photoelectric detector array substrate 220 can further includes a second insulating layer 227 and a protecting layer 228. The second insulating layer 227 covers the thin film transistors 225 of the digital X-ray detecting panel 200 and the photodiodes 226 of the digital X-ray detecting panel 200. The second insulating layer 227 has a number of first openings 2271 corresponding to the photodiodes 226 of the digital X-ray detecting panel 200. A part of each of the photodiodes 226 is exposed from the corresponding first opening 2271. The protecting layer 228 is disposed on the second insulating layer 227 and has a number of second openings 2281 corresponding to the first openings 2271. Each of the first openings 2271 and the corresponding second opening 2281 form a light channel so that the visible light can pass through and arrive to the photodiode 226 successfully. Because FIG. 3 is a schematic view of a pixel of a digital X-ray detecting panel 200, a part of the second insulating layer 227 corresponding to a photoelectric detecting unit 224 and a part of the protecting layer 228 corresponding to a photoelectric detecting unit 224 are shown in FIG. 3.

Material of the second insulating layer 227 can be silicon nitride (Si3N4), silicon dioxide (SiO2) or other suitable material. A thickness of the second insulating layer 228 is, for example, from 2200 angstroms to 2800 angstroms. Preferably, the thickness of the second insulating layer 227 is about 2500 angstroms. Material of the protecting layer 228 can be silicon dioxide (SiO2). A thickness of the protecting layer 228 is, for example, from 1000 angstroms to 2000 angstroms. Preferably, the thickness of the protecting layer 228 is about 1500 angstroms.

Referring to FIG. 2 again, in the present embodiment, the digital X-ray detecting panel 200 can further include at least a driving integrate circuit 230 electrically connected to the photoelectric detector array substrate 220. In the present embodiment, if the X-ray for detecting is not blocked by an object, the X-ray will pass through the wavelength transforming layer 210 of the digital X-ray detecting panel 200 to be transformed into the visible light. The photoelectric detector array substrate 220 is configured for transforming optical signals of the visible light into corresponding electric signals. In detail, when each of the photodiodes 226 of the photoelectric detector array substrate 220 senses optical signals of the visible light from the wavelength transforming layer 210, the optical signals of the visible light are transformed into corresponding electric signals. The electric signals are sent to the corresponding thin film transistors 225 through the second metal layers 2254 of the corresponding thin film transistors 225. Because the thin film transistors 225 that have received the electric signals and the thin film transistors 225 that have not received the electric signals have different statuses (ON state or OFF state), the driving integrate circuit 230 can send digital signals to a computer according to the ON/OFF statuses of the thin film transistors 225 so that the computer can capture an image.

In the present embodiment, the thin film transistor 225 has the oxide semiconductor layer 2253 made of a material of amorphous indium gallium zinc oxide (e.g. a-In$_2$O$_3$—Ga$_2$O$_3$—ZnO or a-InGaZnO$_4$). The visible light transformed from the X-ray by the wavelength transforming layer 210 can not cause the photocurrent in the oxide semiconductor layers 2253. Thus, an electric leakage generated in the thin film transistors 225 can be prevented, and thereby improving the detecting accuracy of the digital X-ray detecting panel. In addition, it is not necessary for the digital X-ray detecting panel of the present invention to form the metal layer and the ohmic contacting layer anymore. As a result, the cost of manufacturing the digital X-ray detecting panel can be reduced, and the manufacturing efficiency of the digital X-ray detecting panel can be increased.

Referring to FIG. 3, a method for manufacturing the digital X-ray detecting panel of the present invention will be described hereinafter. In the present embodiment, the method for manufacturing the digital X-ray detecting panel includes the following processes.

Firstly, a number of thin film transistors 225 arranged in array are formed on a substrate 222. The oxide semiconductor layer 2253 of each of the thin film transistors 225 is formed by a sputtering process.

Then, a photodiode 226 is formed on a second metal layer 2254 of each of the thin film transistors 225.

In detail, the process of forming the thin film transistors 225 includes, for example, forming a first metal layer 2251 on the substrate 222; forming a first insulating layer 2252 on the substrate to cover the first metal layer 2251; forming the oxide semiconductor layer 2253 on the first insulating layer 2252 and above the first metal layer 2251, and forming the second metal layer 2254 on the first insulating layer 2252 to cover a part of the oxide semiconductor layer 2253. The oxide semiconductor layer 2253 is formed by a sputtering process. A temperature of the sputtering process for forming the oxide semiconductor layer 2253 is a room temperature. A sputtering gas of the sputtering process for forming the oxide semiconductor layer 2253 includes an oxygen (O2) and an argon (Ar). A ratio of the oxygen (O2) and the sputtering gas (O2+Ar) is from 0.02 to 0.15. Preferably, the ratio of the oxygen (O2) and the sputtering gas (O2+Ar) is from 0.03 to 0.09.

The thin film transistors 225 of the photoelectric detecting units 224 are formed through the above processes. Then, a photodiode 226 is formed on a second metal layer 2254 of each of the thin film transistors 225. Each of the thin film transistors 225 is electrically connected to the corresponding photodiode 226 through the second metal layer 2254 of the thin film transistor 225. Then, the photoelectric detecting units 224 are formed.

Additionally, the method for manufacturing the digital X-ray detecting panel can further includes the following processes.

Firstly, a second insulating layer 227 is formed to cover the thin film transistors 225 and the photodiodes 226. A number of a first openings 2271 corresponding to the photodiodes 226 are formed in the second insulating layer 227 so that a part of each of the photodiodes 226 is exposed from the corresponding first opening 2271.

Then, a protecting layer 228 is formed on the second insulating layer 227. The protecting layer 228 has a number of second openings 2281 corresponding to the first openings 2271.

In the method for manufacturing the digital X-ray detecting panel of the present invention, processes of forming the metal layer to block the visible light are not necessary anymore. Thus, the cost of manufacturing the digital X-ray detecting panel can be reduced, and the manufacturing efficiency of the digital X-ray detecting panel can be increased.

In summary, the present invention has at least the following advantageousness:

1. The thin film transistors of the digital X-ray detecting panel utilizes the oxide semiconductor layer made of the material of amorphous indium gallium zinc oxide (e.g. a-$In_2O_3$—$Ga_2O_3$—$ZnO$ or a-$InGaZnO_4$). Thus, the visible light can not cause the photocurrent in the oxide semiconductor layers, and thereby avoiding the electric leakage generated in the thin film transistors. Therefore, the detecting accuracy of the digital X-ray detecting panel can be increased effectively.

2. It is not necessary for the digital X-ray detecting panel of the present invention to form the metal layer and the ohmic contacting layer anymore. As a result, the cost of manufacturing the digital X-ray detecting panel can be reduced.

3. In the method for manufacturing the digital X-ray detecting panel of the present invention, the processes of forming the metal layer to block the visible light and forming ohmic contacting layer are not necessary anymore. Thus, the manufacturing efficiency of the digital X-ray detecting panel can be increased.

4. In the method for manufacturing the digital X-ray detecting panel of the present invention, the oxide semiconductor layer made of the material of amorphous indium gallium zinc oxide (e.g. a-$In_2O_3$—$Ga_2O_3$—$ZnO$ or a-$InGaZnO_4$) of the thin film transistor is formed at a low processing temperature. Thus, the low processing temperature can not affect other material of the digital X-ray detecting panel, and thereby improving the quality of the digital X-ray detecting panel.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A digital X-ray detecting panel, comprising:
    a wavelength transforming layer configured for transforming X-ray into visible light; and
    a photoelectric detector array substrate disposed under the wavelength transforming layer, the photoelectric detector array substrate comprising a substrate and a plurality of photoelectric detecting units disposed on the substrate and arranged in an array, each of the photoelectric detecting units comprising a thin film transistor and a photodiode electrically connected to the thin film transistor, and the thin film transistor having an oxide semiconductor layer, wherein the oxide semiconductor layer prevents a photocurrent from being caused in the oxide semiconductor layer when the oxide semiconductor is illuminated by visible light, and an electric leakage generated in the thin film transistor is accordingly prevented.

2. The digital X-ray detecting panel as claimed in claim 1, further comprising a driving integrate circuit electrically connected to the photoelectric detector array substrate.

3. The digital X-ray detecting panel as claimed in claim 1, wherein each of the thin film transistors further comprises:
    a first metal layer disposed on the substrate;
    a first insulating layer disposed on the substrate and covering the first metal layer, and the oxide semiconductor layer being disposed on the first insulating layer and above the first metal layer; and
    a second metal layer disposed on the first insulating layer and covering a part of the oxide semiconductor layer, and each of the thin film transistors being electrically connected to the corresponding photodiode through the second metal layer.

4. The digital X-ray detecting panel as claimed in claim 3, wherein each of the photodiodes is an NIP type photodiode comprising:
    an n-type doped amorphous silicon layer disposed on the second metal layer of the corresponding thin film transistor;
    an amorphous silicon intrinsic layer disposed on the n-type doped amorphous silicon layer;
    a p-type doped amorphous silicon layer disposed on the amorphous silicon intrinsic layer; and
    a transparent electrode layer disposed on the p-type doped amorphous silicon layer.

5. The digital X-ray detecting panel as claimed in claim 3, wherein each of the photodiodes is an MIS type photodiode comprising:

- an insulating layer disposed on the second metal layer of the corresponding thin film transistor;
- an amorphous silicon intrinsic layer disposed on the insulating layer;
- an n-type doped amorphous silicon layer disposed on the amorphous silicon intrinsic layer; and
- a transparent electrode layer disposed on the n-type doped amorphous silicon layer.

6. The digital X-ray detecting panel as claimed in claim 3, wherein the photoelectric detector array substrate further comprises:

- a second insulating layer covering the thin film transistors and the photodiodes, the second insulating layer having a plurality of a first openings corresponding to the photodiodes, and a part of each photodiode being exposed from the corresponding first opening; and
- a protecting layer disposed on the second insulating layer, and the protecting layer having a plurality of second openings corresponding to the first openings.

7. The digital X-ray detecting panel as claimed in claim 1, wherein the oxide semiconductor layer is made of a material of amorphous indium gallium zinc oxide.

8. The digital X-ray detecting panel as claimed in claim 1, wherein a thickness of the oxide semiconductor layer is from 500 angstroms to 1500 angstroms.

9. The digital X-ray detecting panel as claimed in claim 1, wherein a thickness of the oxide semiconductor layer is from 600 angstroms to 900 angstroms.

* * * * *